(12) United States Patent
Killen, Jr. et al.

(10) Patent No.: US 11,867,201 B2
(45) Date of Patent: Jan. 9, 2024

(54) ACOUSTIC ATTENUATION DEVICE

(71) Applicant: Sanmina Corporation, San Jose, CA (US)

(72) Inventors: Odie Banks Killen, Jr., Colorado Springs, CO (US); Bradley S. Holway, Manitou Springs, CO (US); Matthew J. Babcock, Monument, CO (US)

(73) Assignee: Sanmina Corporation, San Jose, CA (US)

( * ) Notice: Subject to any disclaimer, the term of this patent is extended or adjusted under 35 U.S.C. 154(b) by 0 days.

(21) Appl. No.: 17/574,535

(22) Filed: Jan. 12, 2022

(65) Prior Publication Data

US 2023/0228283 A1 Jul. 20, 2023

Related U.S. Application Data

(60) Provisional application No. 63/295,827, filed on Dec. 31, 2021.

(51) Int. Cl.
*F04D 29/66* (2006.01)
*F04D 29/54* (2006.01)
(Continued)

(52) U.S. Cl.
CPC .......... *F04D 29/664* (2013.01); *F04D 19/002* (2013.01); *F04D 29/541* (2013.01);
(Continued)

(58) Field of Classification Search
CPC ........... H05K 7/20145; H05K 7/20736; H05K 7/20172; H05K 7/20727; H05K 7/202;
(Continued)

(56) References Cited

U.S. PATENT DOCUMENTS 6,104,608 A 8/2000 Casinelli et al.
6,454,527 B2 * 9/2002 Nishiyama ............. B60K 11/08
415/173.1
(Continued)

FOREIGN PATENT DOCUMENTS

CN 106704226 A * 5/2017
CN 213628058 U * 7/2021 ........... F04D 19/002
DE 102016013639 A1 * 5/2018 ......... F04D 25/0613

OTHER PUBLICATIONS

Machine Translation of CN106704226 Retrieved from: Espacenet. (Year: 2017).*

(Continued)

*Primary Examiner* — Igor Kershteyn
*Assistant Examiner* — Wesley Le Fisher
(74) *Attorney, Agent, or Firm* — Julio Loza; LOZA & LOZA, LLP

(57) ABSTRACT

One feature pertains to an acoustic attenuation device. The acoustic attenuation device comprises a fan assembly, the fan assembly including at least one fan module that directs airflow in at least one direction, wherein the at least one fan module includes a top surface and a bottom surface, a plurality of air deflectors mounted to the top surface and the bottom surface of the at least one fan module, wherein the plurality of air deflectors include a plurality of surfaces, and wherein at least one of the plurality of surfaces is an angled surface that redirects the airflow 90-degrees, and acoustic attenuating foam, wherein the acoustic attenuating foam has a two-dimensional (2-D) surface and is applied to interior surfaces of the plurality of surfaces.

12 Claims, 8 Drawing Sheets

(51) Int. Cl.
- *H05K 7/20* (2006.01)
- *F04D 25/06* (2006.01)
- *F04D 19/00* (2006.01)
- *G11B 33/08* (2006.01)
- *F04D 25/16* (2006.01)
- *G11B 33/14* (2006.01)

(52) U.S. Cl.
CPC ......... *G11B 33/08* (2013.01); *H05K 7/20145* (2013.01); *H05K 7/20172* (2013.01); *H05K 7/20736* (2013.01); *F04D 25/166* (2013.01); *G11B 33/142* (2013.01)

(58) Field of Classification Search
CPC ...... H05K 7/206; H05K 7/20754; G03F 1/20; F04D 29/664; F04D 29/667
See application file for complete search history.

(56) References Cited

U.S. PATENT DOCUMENTS

| | | | |
|---|---|---|---|
| 6,594,148 B1* | 7/2003 | Nguyen | G11B 33/124 361/695 |
| 8,257,156 B2* | 9/2012 | Shabany | H05K 7/20572 361/695 |
| 8,446,725 B2* | 5/2013 | Lam | H05K 7/20145 361/679.5 |
| 8,701,821 B2 | 4/2014 | O'Coimin et al. | |
| 8,705,201 B2 | 4/2014 | Casey et al. | |
| 9,332,679 B2* | 5/2016 | Carl, Jr. | H05K 7/20772 |
| 9,901,011 B2* | 2/2018 | Heim | H05K 7/20745 |
| 10,019,045 B2* | 7/2018 | Kruse | H05K 7/20145 |
| 10,077,784 B2* | 9/2018 | Schulze | H05K 7/20172 |
| 10,240,615 B1 | 3/2019 | Kho et al. | |
| 10,565,974 B1 | 2/2020 | Bhatia et al. | |
| 10,660,223 B2* | 5/2020 | Sassano | H05K 5/0213 |
| 11,243,584 B2* | 2/2022 | Schnell | H05K 7/20727 |
| 2002/0015640 A1* | 2/2002 | Nishiyama | F01P 11/12 415/119 |
| 2007/0274036 A1 | 11/2007 | Walsh et al. | |
| 2009/0168330 A1* | 7/2009 | Li | G06F 1/20 361/695 |
| 2011/0284316 A1 | 11/2011 | O'Coimin et al. | |
| 2012/0033379 A1 | 2/2012 | Lam et al. | |
| 2017/0221526 A1 | 8/2017 | Albrecht et al. | |
| 2018/0330712 A1 | 11/2018 | Chen et al. | |
| 2023/0020411 A1* | 1/2023 | Adrian | G11B 33/08 |

OTHER PUBLICATIONS

Machine Translation of CN213628058U Retrieved from: Espacenet. (Year: 2021).*

Machine Translation of DE102016013639A1 Retrieved from: Espacenet. (Year: 2018).*

Corresponding EP Application No. 22210946. Extended Search Report (dated May 23, 2023).

* cited by examiner

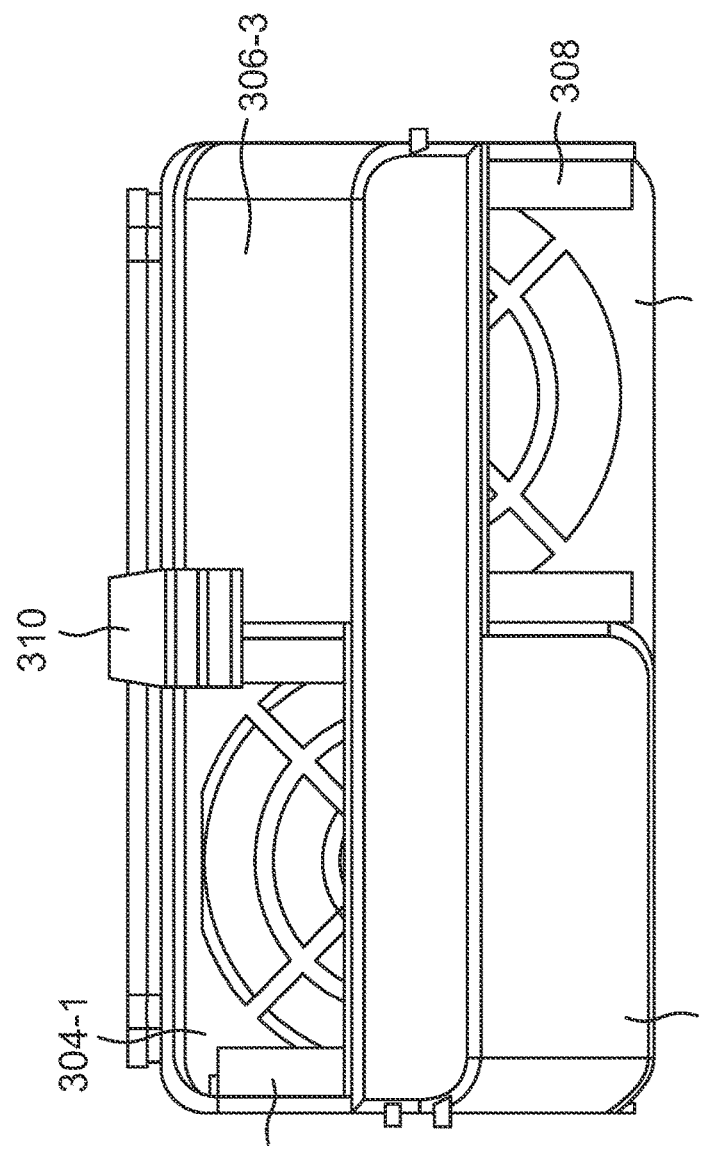
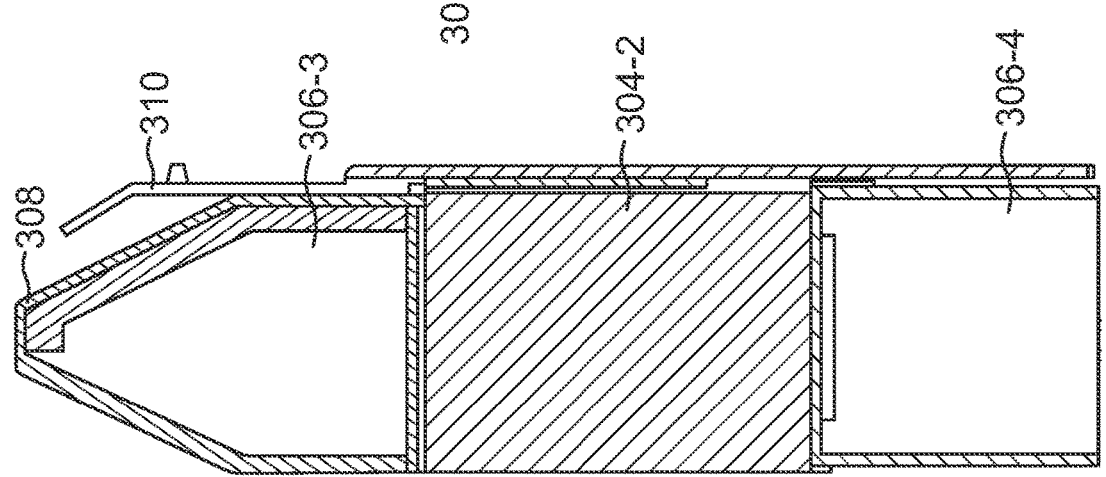

ACOUSTIC ATTENUATION DEVICE

FIELD

This application relates to data storage systems and, in particular, to retrofit acoustic attenuation devices for use in data storage systems.

BACKGROUND

Data storage systems that store hard drives often employ fans which cool the stored hard drives to maintain hard drive performance. These fans generate airflow energy from outputted air and vibrational energy from the rotating fans, which both produce acoustic frequencies harmful to the performance of the stored hard drives. Efforts to dampen such acoustic frequencies may include implementing acoustic attenuating foam in components of data storage systems. However, the acoustic attenuating foam commonly features a three-dimensional (3-D) surface and consumes additional space within the components of the data storage systems. To weaken acoustic frequencies that negatively affect hard drive performance without complex acoustic attenuating foam, existing components in data storage systems may need to be fabricated differently. As such, there is a need for a way to retrofit existing components in data storage systems to reduce acoustic frequencies and improve hard drive performance.

SUMMARY

The following presents a simplified summary of one or more examples in order to provide a basic understanding of some implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

According to one feature, an acoustic attenuation device is provided. The acoustic attenuation device comprises a fan assembly, the fan assembly including at least one fan module that directs airflow in at least one direction, wherein the at least one fan module includes a first side and a second side, a plurality of air deflectors mounted to the first side and the second side of the at least one fan module, wherein the plurality of air deflectors include a plurality of surfaces, and wherein at least one of the plurality of surfaces is an angled surface that redirects the airflow approximately 90-degrees, and acoustic attenuating foam, wherein the acoustic attenuating foam has a two-dimensional (2-D) surface and is applied to interior surfaces of the plurality of surfaces.

According to one aspect, the acoustic attenuating foam has a thickness between 1 millimeter (mm) and 5 mm.

According to another aspect, the acoustic attenuating foam is arranged to completely cover the interior surfaces of the plurality of surfaces.

According to yet another aspect, the acoustic attenuating foam attenuates at least one of airflow energy and vibrational energy generated by the at least one fan module.

According to yet another aspect, the interior surfaces of the plurality of surfaces are arranged with exposure to a vent of the at least one fan module to form an air outlet.

According to yet another aspect, the plurality of air deflectors include a first air deflector and a second air deflector mounted on opposite sides of a first fan module, and a third air deflector and a fourth air deflector mounted on opposite sides of a second fan module.

According to yet another aspect, the first air deflector is adjacent to the third air deflector, and wherein the second air deflector is adjacent to the fourth air deflector.

According to yet another aspect, an air outlet of the first air deflector faces an opposite direction to that of an air outlet of the third air deflector, and wherein an air outlet of the second air deflector faces an opposite direction to that of an air outlet of the fourth air deflector.

According to yet another aspect, the fan assembly includes a first fan module that directs airflow in a first direction, and a second fan module that directs airflow in a second direction.

According to yet another aspect, the first fan module is adjacent to the second fan module, and wherein the first direction is opposite of the second direction.

According to another feature, a system is provided. The system comprises a data storage housing, a plurality of hard drives positioned within the data storage housing, and at least one acoustic attenuation device positioned between the plurality of hard drives within the data storage housing, and wherein the at least one acoustic attenuation device includes a fan assembly, the fan assembly including at least one fan module that directs airflow in at least one direction, wherein the at least one fan module includes a first side and a second side, a plurality of air deflectors mounted to the first side and the second side of the at least one fan module, wherein the plurality of air deflectors include a plurality of surfaces, and wherein at least one of the plurality of surfaces is an angled surface that redirects the airflow approximately 90-degrees, and acoustic attenuating foam, wherein the acoustic attenuating foam has a 2-D surface and is applied to interior surfaces of the plurality of surfaces.

According to one aspect, the data storage housing includes a plurality of enclosing surfaces, and wherein another acoustic attenuating foam is applied to interior surfaces of the plurality of enclosing surfaces.

According to another aspect, the acoustic attenuating foam has a thickness between 1 mm and 5 mm.

According to yet another aspect, the acoustic attenuating foam is arranged to completely cover the interior surfaces of the plurality of surfaces.

According to yet another aspect, the interior surfaces of the plurality of surfaces are arranged with exposure to a vent of the at least one fan module to form an air outlet.

According to yet another aspect, the plurality of air deflectors include a first air deflector and a second air deflector mounted on opposite sides of a first fan module, and a third air deflector and a fourth air deflector mounted on opposite sides of a second fan module.

According to yet another aspect, the first air deflector is adjacent to the third air deflector, and wherein the second air deflector is adjacent to the fourth air deflector.

According to yet another aspect, an air outlet of the first air deflector faces an opposite direction to that of an air outlet of the third air deflector, and wherein an air outlet of the second air deflector faces an opposite direction to that of an air outlet of the fourth air deflector.

According to yet another aspect, the fan assembly includes a first fan module that directs airflow in a first direction, and a second fan module that is adjacent to the first fan module, and wherein the second fan module directs airflow in a second direction that is opposite of the first direction.

According to yet another feature, an air deflector for an acoustic attenuation device is provided. The air deflector for the acoustic attenuation device comprises a plurality of surfaces, wherein at least one of the plurality of surfaces is an angled surface that redirects airflow approximately 90-degrees, and acoustic attenuating foam, wherein the acoustic attenuating foam has a 2-D surface and is applied to interior surfaces of the plurality of surfaces.

BRIEF DESCRIPTION OF THE DRAWINGS

FIG. 3D depicts a right side inner perspective view of the exemplary acoustic attenuation device of FIG. 3A.

FIG. 3E depicts a top perspective view of the exemplary acoustic attenuation device of FIG. 3A.

Throughout the description, similar reference numbers may be used to identify similar elements.

DETAILED DESCRIPTION

Figure 1A:
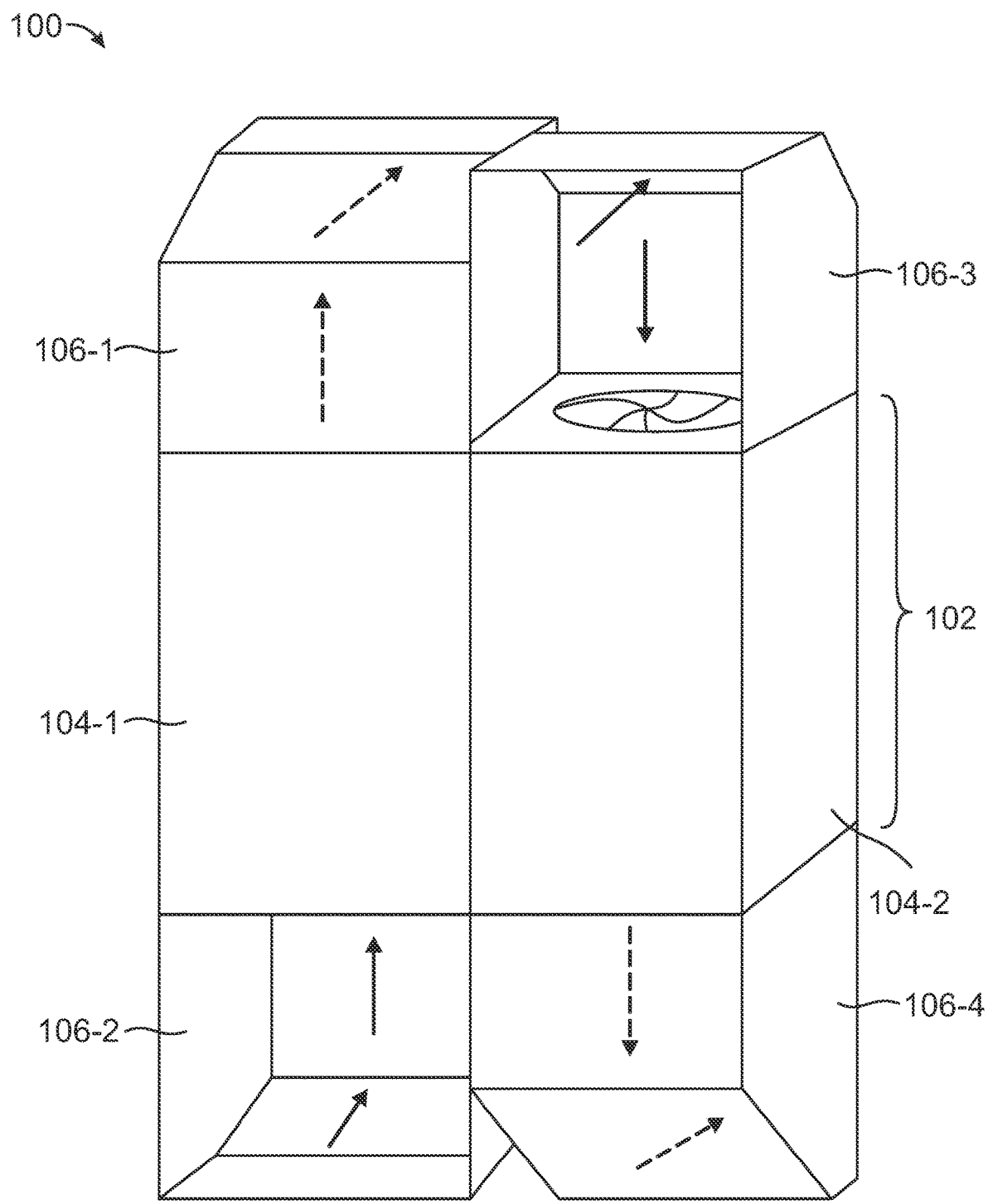
FIG. 1A depicts an isometric view of components included in an acoustic attenuation device.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details.

The word "exemplary" or "embodiment" is used herein to mean "serving as an example, instance, or illustration." Any implementation or aspect described herein as "exemplary" or as an "embodiment" is not necessarily to be construed as preferred or advantageous over other aspects of the disclosure. Likewise, the term "aspects" does not require that all aspects of the disclosure include the discussed feature, advantage, or mode of operation.

Embodiments will now be described in detail with reference to the accompanying drawings. In the following description, numerous specific details are set forth in order to provide a thorough understanding of the aspects described herein. It will be apparent, however, to one skilled in the art, that these and other aspects may be practiced without some or all of these specific details. In addition, well known steps in a method of a process may be omitted from flow diagrams presented herein in order not to obscure the aspects of the disclosure. Similarly, well known components in a device may be omitted from figures and descriptions thereof presented herein in order not to obscure the aspects of the disclosure.

Overview

The present disclosure is directed to improving the performance of hard drives and implementation of acoustic attenuation devices in data storage systems. More specifically, an acoustic attenuation device, with acoustic attenuating foam, can be implemented in standard data storage systems.

According to one aspect, an acoustic attenuation device may include a fan assembly, a plurality of air deflectors, and acoustic attenuating foam. The fan assembly may include at least one fan module that directs airflow in at least one direction, where the at least one fan module includes a top surface and a bottom surface, and where the plurality of air deflectors may be mounted to the top surface and the bottom surface of the at least one fan module. The plurality of air deflectors may include a plurality of surfaces, where at least one of the plurality of surfaces is an angled surface that redirects the airflow 90-degrees. Additionally, the acoustic attenuating foam may have a two-dimensional (2-D) surface and may be applied to interior surfaces of the plurality of surfaces.

Exemplary Implementations of Acoustic Attenuating Foam

In some embodiments, a data storage system may include hard drives and fans which cool the hard drives to maintain hard drive performance. As an example, the data storage system may include low capacity hard drives and/or high capacity hard drives (e.g., helium-based hard drives). Such hard drives may be sensitive to energy (e.g., airflow energy, vibrational energy, etc.) generated by the fans included in the data storage system because the fans emit acoustic frequencies that negatively affects the performance of the hard drives. Efforts to weaken the acoustic frequencies emitted by the fans include implementing acoustic attenuating foam within components of the data storage system. Conventional implementations often involve the acoustic attenuating foam having a three-dimensional (3-D) surface and/or consuming additional space within the data storage system, each of which may impede airflow and/or may involve additional structural changes to the data storage system and/or its components. However, by applying acoustic attenuating foam with a two-dimensional (2-D) surface to the components within the data storage system, a minimal amount of additional space may be consumed, and airflow volume may be maintained (e.g., without significantly diminish the airflow rate). Thus, the components within the data storage system can be retrofitted with the acoustic attenuating foam while minimizing or avoiding structural changes within the data storage system.

By retrofitting components within a data storage system with acoustic attenuating foam that has a 2-D surface, the overall performance of hard drives included in the data storage system may be improved. For example, implementing such acoustic attenuating foam may result in up to, for example, a 90% improvement of hard drive performance because acoustic frequencies from the fans which decrease hard drive performance may be attenuated before affecting the hard drives. Additionally, hard drive performance may be improved because high capacity hard drives and more specifically, helium-based hard drives, can be implemented in data storage systems. Although helium-filled hard drives and other high capacity hard drives are more sensitive to acoustic energy than low capacity hard drives, such high capacity hard drives can be implemented because the acoustic attenuating foam minimizes acoustic energy within the data storage system.

Other advantages of implementing acoustic attenuating foam may include, but are not limited to, lower costs in fabricating data storage systems and/or their components, simpler fabrication techniques for the data storage systems and/or their components, and leverage of existing techniques for cooling data storage systems and/or their components.

Acoustic Attenuation Device

FIG. 1A depicts an isometric view of components included in an acoustic attenuation device 100. As shown, the acoustic attenuation device 100 includes a fan assembly 102 and a plurality of air deflectors that include acoustic attenuating foam (not shown). The fan assembly 102 may house one or more fans that draw air from an intake or inlet side of the fan assembly and pushes it out an exhaust or outlet side. The plurality of air deflectors may be configured to deflect air flow in a desired direction (e.g., at a right angle to the airflow through the fan assembly 102. In this example, the fan assembly 102 includes a first fan module 104-1 and a second fan module 104-2. The plurality of air deflectors include a first air deflector 106-1, a second air deflector 106-2, a third air deflector 106-3, and a fourth air deflector 106-4.

In an embodiment, the first fan module 104-1 and the second fan module 104-2 are adjacent and aligned in parallel to each other. As an example, the first fan module 104-1 and the second fan module 104-2 may include fan components which may be powered to produce airflow. The first fan module 104-1 directs airflow in a first direction (shown by arrows above and below the first fan module 104-1) and the second fan module 104-2 directs airflow in a second direction (shown by arrows above and below the second fan module 104-2). The airflow directed in the first direction by the first fan module 104-1 enters the first fan module 104-1 through the second air deflector 106-2 and exits the first fan module 104-1 via the first air deflector 106-1. The airflow directed in the second direction by the second fan module 104-2 enters the second fan module 104-2 through the third air deflector 106-3 and exits the second fan module 104-2 via the fourth air deflector 106-4. As such, the airflow directed in the first direction by the first fan module 104-1 is opposite of the airflow directed in the second direction by the second fan module 104-2. Additionally, the first fan module 104-1 and the second fan module 104-2 each include a top surface and a bottom surface, such that the top surface and the bottom surface feature vents that facilitate input and output of the airflow for the fan modules.

In an embodiment, the first fan module 104-1 and the second fan module 104-2 may be made of a plastic, a metal, a composite material, or any combination thereof. The first fan module 104-1 and the second fan module 104-2 may each have a length greater than 30 millimeters (mm), a width greater than 30 mm, and a height greater than 40 mm. Although the acoustic attenuation device is shown as including two fan modules 104-1 and 104-2, the acoustic attenuation device may also have less than two or more than two fan modules. Additionally, although the fan modules 104-1 and 104-2 are described as having an airflow directed in two opposing directions, the fan modules may also direct airflow in one direction or more than two directions, and/or in the same direction.

The first air deflector 106-1 and the second air deflector 106-2 are mounted on opposite sides of the first fan module 104-1, such that the first air deflector 106-1 is mounted to a top (or first) surface of the first fan module and the second air deflector 106-2 is mounted to a bottom (or second) surface of the first fan module. Additionally, the third air deflector 106-3 and the fourth air deflector 106-4 are mounted on opposite sides of the second fan module 104-2, such that the third air deflector 106-3 is mounted to a top surface of the second fan module and the fourth air deflector 106-4 is mounted to a bottom surface of the second fan module. As an example, the air deflectors 106-1, 106-2, 106-3, and 106-4 are mounted over vents of the fan modules 104-1 and 104-2. In an embodiment, the first air deflector 106-1 is adjacent to the third air deflector 106-3 and the second air deflector 106-2 is adjacent to the fourth air deflector 106-4. The air deflectors 106-1, 106-2, 106-3, and 106-4 include a plurality of surfaces. In an embodiment, the plurality of surfaces include an angled surface that redirects airflow approximately 90-degrees. Other implementations are contemplated in which the air deflectors may have different angles to redirect airflow less than 90 degrees (e.g., 30 degrees, 45 degrees, 60 degrees, or more than 90 degrees (e.g., 120 degrees, etc.). As an example, the angled surface may be angled between 10-degrees and 80-degrees with respect to a vent of the first fan module 104-1 or the second fan module 104-2. Furthermore, three surfaces of the plurality of surfaces are adjoined to the angled surface and are adjacent to the first fan module 104-1 or the second fan module 104-2.

Additionally, interior surfaces of the plurality of surfaces are arranged with exposure to a vent of the first fan module 104-1 or the second fan module 104-2 to form an air outlet for airflow. As an example, the interior surfaces of the plurality of surfaces may be defined as surfaces which redirect airflow. As shown, an air outlet of the first air deflector 106-1 faces an opposite direction to that of an air outlet of the third air deflector 106-3, and an air outlet of the second air deflector 106-2 faces an opposite direction to that of an air outlet of the fourth air deflector 106-4. The first air deflector 106-1 redirects airflow exiting the first fan module 104-1 in the first direction and the second air deflector 106-2 redirects airflow entering the first fan module 104-1 in the first direction. Additionally, the third air deflector 106-3 redirects airflow entering the second fan module 104-2 in the second direction and the fourth air deflector 106-4 redirects airflow exiting the second fan module 104-2 in the second direction.

In an embodiment, the plurality of air deflectors 106-1, 106-2, 106-3, and 106-4 may each be made of a plastic, a metal, a composite material, or any combination thereof. The air deflectors 106-1, 106-2, 106-3, and 106-4 may each have a length greater than 30 mm, a width greater than 30 mm, and a height greater than 30 mm. Although the air deflectors 106-1, 106-2, 106-3, and 106-4 are described as redirecting airflow approximately 90-degrees, the air deflectors may redirect airflow at angles greater than 90-degrees or less than 90-degrees. Additionally, although the acoustic attenuation device is shown as including four air deflectors 106-1, 106-2, 106-3, and 106-4, the acoustic attenuation device may also include less than four or more than four air deflectors. Furthermore, although the air deflectors 106-1, 106-2, 106-3, and 106-4 are shown as being configured in a certain arrangement, the air deflectors may also be configured in other arrangements.

Additionally, the plurality of air deflectors 106-1, 106-2, 106-3, and 106-4 include acoustic attenuating foam (not shown). The acoustic attenuating foam attenuates airflow energy and/or vibrational energy generated by the first fan module 104-1 and/or the second fan module 104-2. In an embodiment, the acoustic attenuating foam has a 2-D surface. The acoustic attenuating foam is applied to interior surfaces (e.g., flat interior surfaces) of the plurality of surfaces of the plurality of air deflectors 106-1, 106-2, 106-3, and 106-4. As an example, the acoustic attenuating foam may be applied to interior surfaces of the plurality of air deflectors 106-1, 106-2, 106-3, and 106-4 which are exposed to a vent of the fan modules 104-1 and 104-2. Additionally, the acoustic attenuating foam may be arranged to completely cover (or almost completely cover) the interior surfaces of the plurality of surfaces. The acoustic attenuating foam consumes minimal space within the plurality of air deflectors 106-1, 106-2, 106-3, and 106-4, and has minimal impact on airflow.

In an embodiment, the acoustic attenuating foam is constructed of a foam material, for example, the foam produced by Aearo Technologies, LLC. The acoustic attenuating foam may have a thickness between approximately 1 mm and 5 mm. Additionally, the acoustic attenuating foam may be applied to interior surfaces of the air deflectors 106-1, 106-2, 106-3, and 106-4 before the air deflectors are mounted to the fan assembly 102. The acoustic attenuating foam may also be retrofitted to the acoustic attenuation device 100 so that no structural changes are necessary to allow implementation of the acoustic attenuating foam.

Figure 1B:
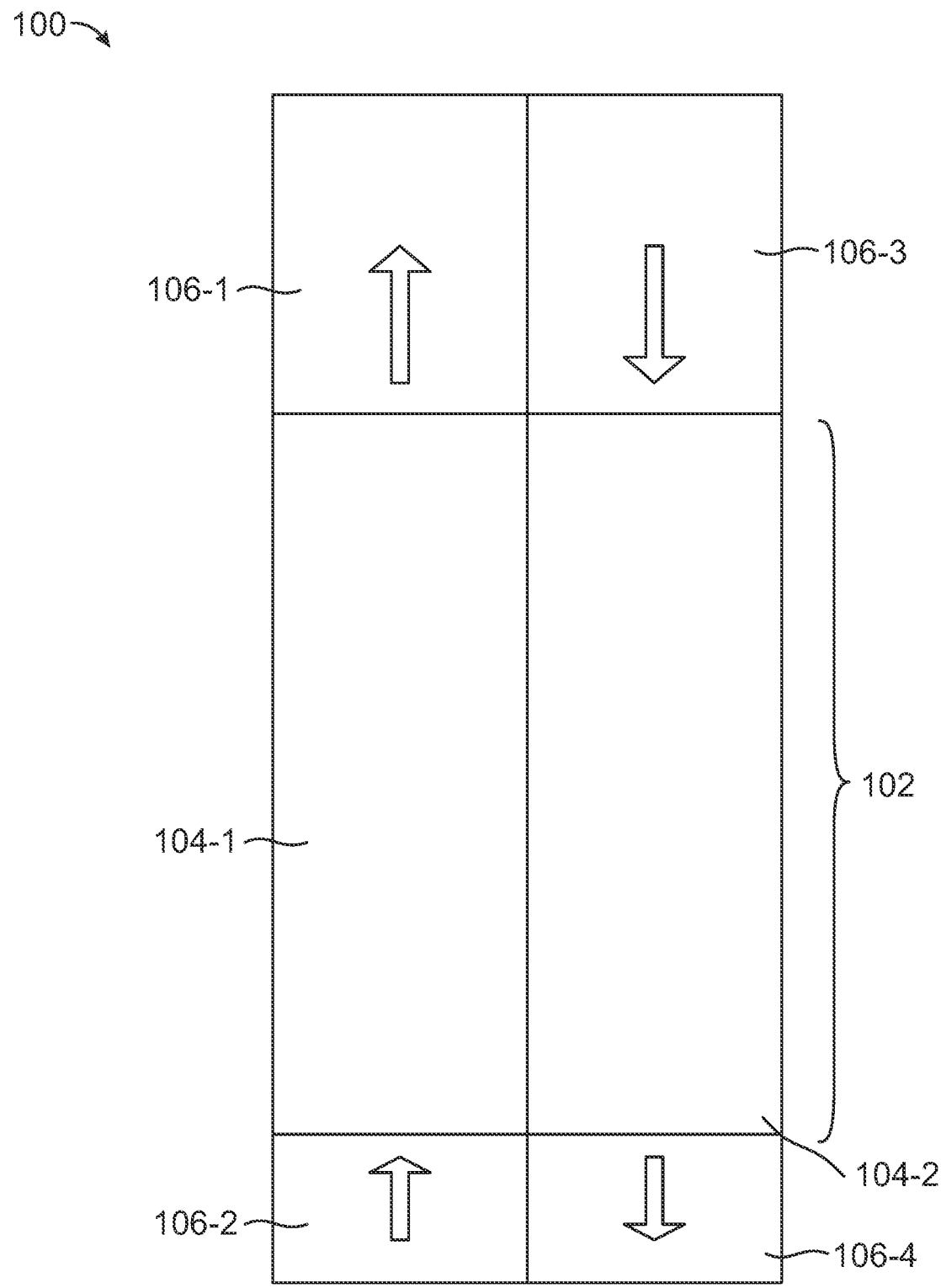
FIG. 1B depicts a front perspective view of the acoustic attenuation device of FIG. 1A.

FIG. 1B depicts a front perspective view of the acoustic attenuation device 100 of FIG. 1A. As shown, the acoustic attenuation device includes the fan assembly 102 with the first fan module 104-1 and the second fan module 104-2, as well as the plurality of air deflectors that includes the first air deflector 106-1, the second air deflector 106-2, the third air deflector 106-3, and the fourth air deflector 106-4, each of which are implemented as previously described with reference to FIG. 1A. Additionally, the first fan module 104-1 directs airflow in the first direction (shown by arrows above and below the first fan module 104-1) and the second fan module 104-2 directs airflow in the second direction (shown by arrows above and below the second fan module 104-2) as described with reference to FIG. 1A.

Figure 1C:
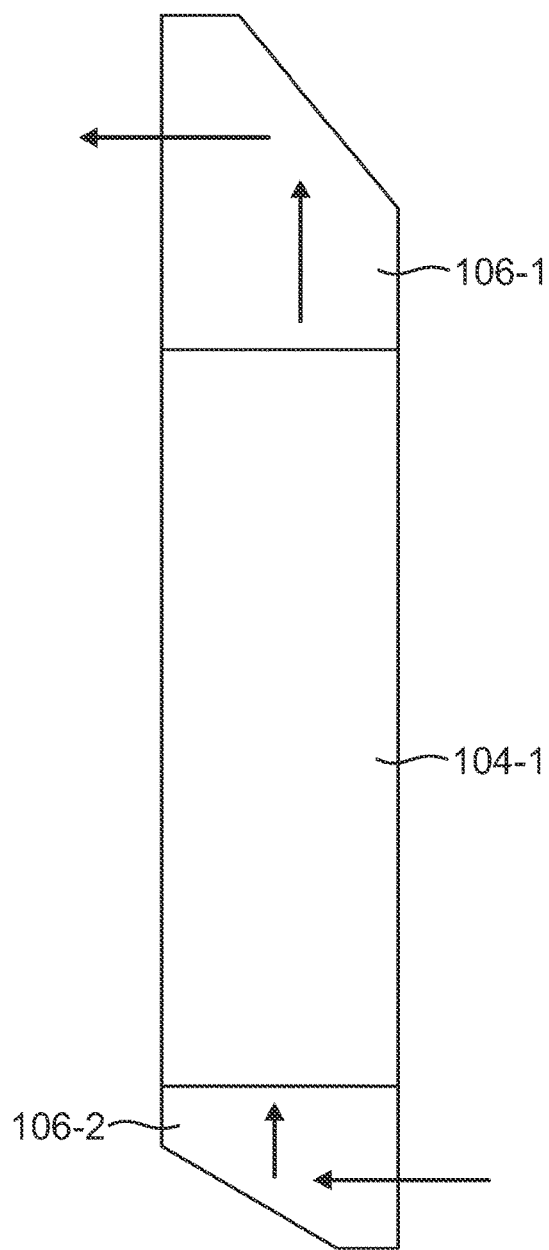
FIG. 1C depicts a left side perspective view of the acoustic attenuation device of FIG. 1A.

FIG. 1C depicts a left side perspective view of the acoustic attenuation device 100 of FIG. 1A. As shown, the acoustic attenuation device includes the first fan module 104-1, the first air deflector 106-1, and the second air deflector 106-2, each of which are implemented as previously described with reference to FIG. 1A. Additionally, the first fan module 104-1 directs airflow in the first direction (shown by arrows above and below the first fan module 104-1), where the first air deflector 106-1 redirects airflow exiting the first fan module 104-1 in the first direction and the second air deflector 106-2 redirects airflow entering the first fan module 104-1 in the first direction as described with reference to FIG. 1A. Although not shown, the second fan module 104-2, the third air deflector 106-3, and the fourth air deflector 106-4 are behind the first fan module 104-1, the first air deflector 106-1, and the second air deflector 106-2 from the left side perspective view of FIG. 1C.

Figure 1D:
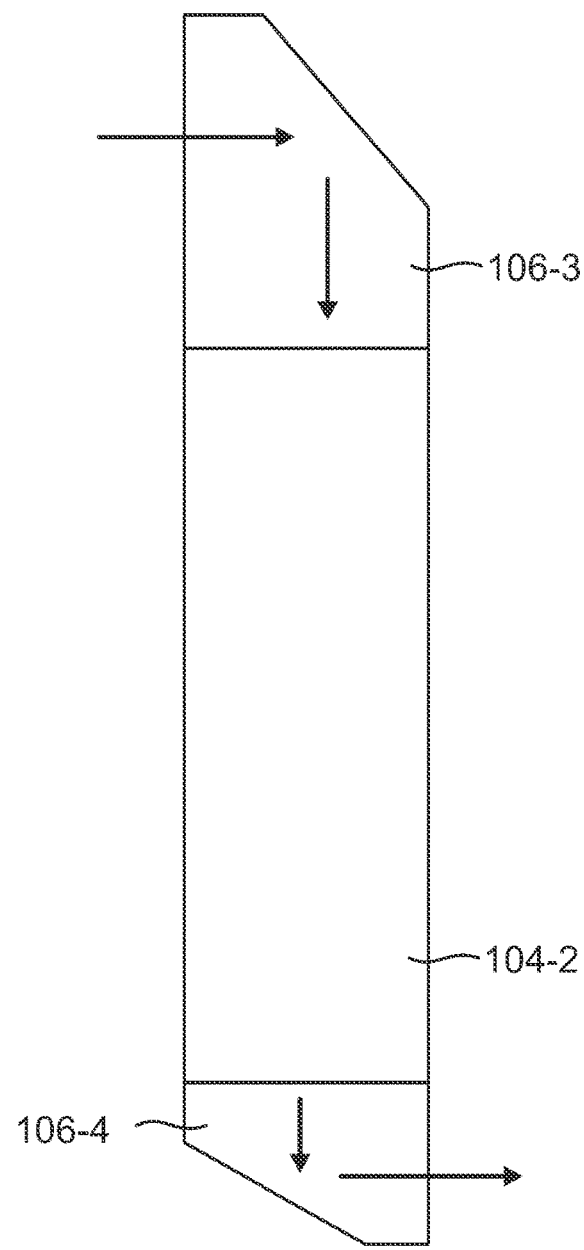
FIG. 1D depicts a right side perspective view of the acoustic attenuation device of FIG. 1A.

FIG. 1D depicts a right side perspective view of the acoustic attenuation device 100 of FIG. 1A. As shown, the acoustic attenuation device includes the second fan module 104-2, the third air deflector 106-3, and the fourth air deflector 106-4, each of which are implemented as previously described with reference to FIG. 1A. Additionally, the second fan module 104-2 directs airflow in the second direction (shown by arrows above and below the second fan module 104-2), where the third air deflector 106-3 redirects airflow entering the second fan module 104-2 in the second direction and the fourth air deflector 106-4 redirects airflow exiting the second fan module 104-2 in the second direction as described with reference to FIG. 1A. Although not shown, the first fan module 104-1, the first air deflector 106-1, and the second air deflector 106-2 are behind the second fan module 104-2, the third air deflector 106-3, and the fourth air deflector 106-4 from the right side perspective view of FIG. 1D.

In some embodiments, an acoustic attenuation device includes a fan assembly that includes at least one fan module that includes a top surface and a bottom surface, and a plurality of air deflectors mounted to the top surface and the bottom surface of the at least one fan module as previously described with reference to FIGS. 1A-1D. The at least one fan module directs airflow in at least one direction and the plurality of air deflectors include a plurality of surfaces, where at least one of the plurality of surfaces is an angled surface that redirects the airflow 90-degrees. The acoustic attenuation device also includes acoustic attenuating foam, where the acoustic attenuating foam has a 2-D surface and is applied to interior surfaces of the plurality of surfaces. As an example, the acoustic attenuating foam is retrofitted to the plurality of air deflectors to allow the acoustic attenuating foam to be implemented, without structural changes, in the acoustic attenuation device.

System Including an Acoustic Attenuation Device

Figure 2A:
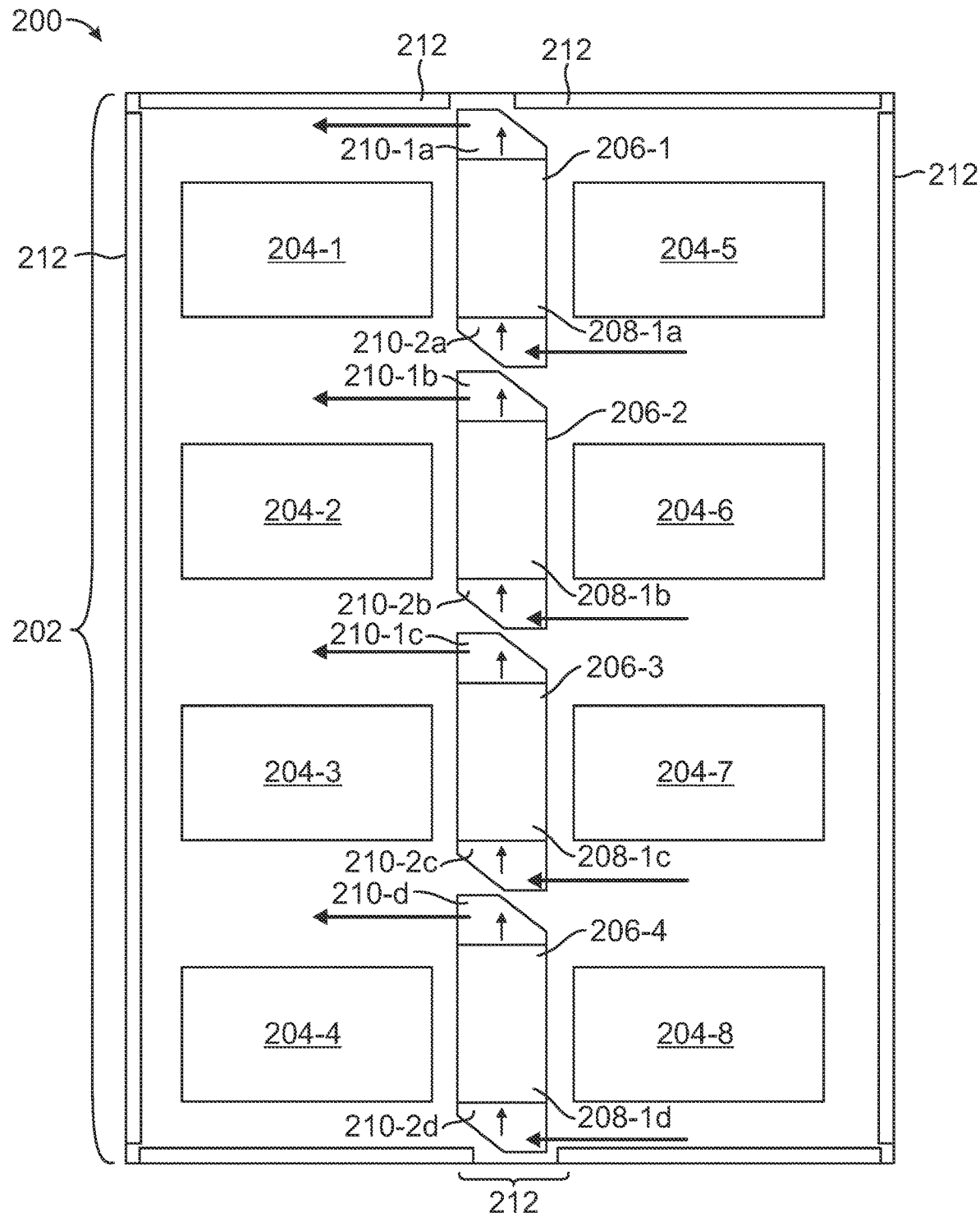
FIG. 2A depicts a left side perspective view of a system that includes one or more acoustic attenuation devices.

FIG. 2A depicts a left side perspective view of a system 200 that includes one or more acoustic attenuation devices. In an embodiment, the system 200 may be a data storage system. As shown, the system 200 includes a data storage housing 202, a plurality of hard drives 204-1, 204-2, 204-3, 204-4, 204-5, 204-6, 204-7, and 204-8, and a plurality of acoustic attenuation devices 206-1, 206-2, 206-3, and 206-4.

The acoustic attenuation devices 206-1, 206-2, 206-3, and 206-4 may have similar functionality as those shown in FIGS. 1A-1D. As shown, the acoustic attenuation devices 206-1, 206-2, 206-3, and 206-4 include first fan modules 208-1a, 208-1b, 208-1c, and 208-1d, first air deflectors 210-1a, 210-1b, 210-1c, and 210-1d, and second air deflectors 210-2a, 210-2b, 210-2c, and 210-2d, respectively. Although not shown, the acoustic attenuation devices 206-1, 206-2, 206-3, and 206-4 also include second fan modules, third air deflectors, and fourth air deflectors behind the first fan modules, the first air deflectors, and the second air deflectors. Interior surfaces of the first, second, third, and fourth air deflectors of the acoustic attenuation devices 206-1, 206-2, 206-3, and 206-4 include acoustic attenuating foam (not shown). Additionally, the acoustic attenuation devices 206-1, 206-2, 206-3, and 206-4 direct airflow in first directions (shown by the arrows above and below the first fan modules 208-1a, 208-1b, 208-1c, and 208-1d) and in second directions (not shown), where the first directions are opposite of the second directions.

In an embodiment, the acoustic attenuation devices 206-1, 206-2, 206-3, and 206-4 are centrally positioned between the plurality of hard drives 204-1, 204-2, 204-3, 204-4, 204-5, 204-6, 204-7, and 204-8 in the system 200 to allow horizontal airflow over the plurality of hard drives. The acoustic attenuation devices 206-1, 206-2, 206-3, and 206-4 are also vertically aligned within the center of the system 200 to further increase airflow circulation throughout the system 200. Such positioning eliminates the need for a plenum space and allows for greater hard drive density (and a shorter overall chassis) within the system 200.

The data storage housing 202 includes a plurality of enclosing surfaces which include another acoustic attenuating foam 212. As an example, the acoustic attenuating foam 212 may be similar to the acoustic attenuating foam previously described with reference to FIG. 1A. In an embodiment, the acoustic attenuating foam is applied to interior surfaces of the plurality of enclosing surfaces to help further attenuate acoustic frequencies generated by fan modules of the acoustic attenuation devices 206-1, 206-2, 206-3, and 206-4. The plurality of enclosing surfaces may be arranged to enclose the acoustic attenuation devices 206-1, 206-2, 206-3, and 206-4, and the plurality of hard drives 204-1, 204-2, 204-3, 204-4, 204-5, 204-6, 204-7, and 204-8, allowing airflow to circulate within the system 200. The plurality of hard drives 204-1, 204-2, 204-3, 204-4, 204-5, 204-6, 204-7, and 204-8 may be arranged into two columns on opposing sides of the acoustic attenuation devices and into four rows centrally aligned with the acoustic attenuation devices. Additionally, the plurality of hard drives 204-1, 204-2, 204-3, 204-4, 204-5, 204-6, 204-7, and 204-8 may be low capacity hard drives, high capacity hard drives (e.g., helium-based hard drives), or any combination thereof.

In an embodiment, the data storage housing 202 may include an infrastructure to which components of the system 200 may be mounted. Additionally, the data storage housing may be made of a plastic, a metal, a composite material, or any combination thereof. The data storage housing 202 may have a length greater than 360 mm, a width greater than 360 mm, and a height greater than 540 mm. As such, the data storage housing 202 may resemble a rectangular prism.

Figure 2B:
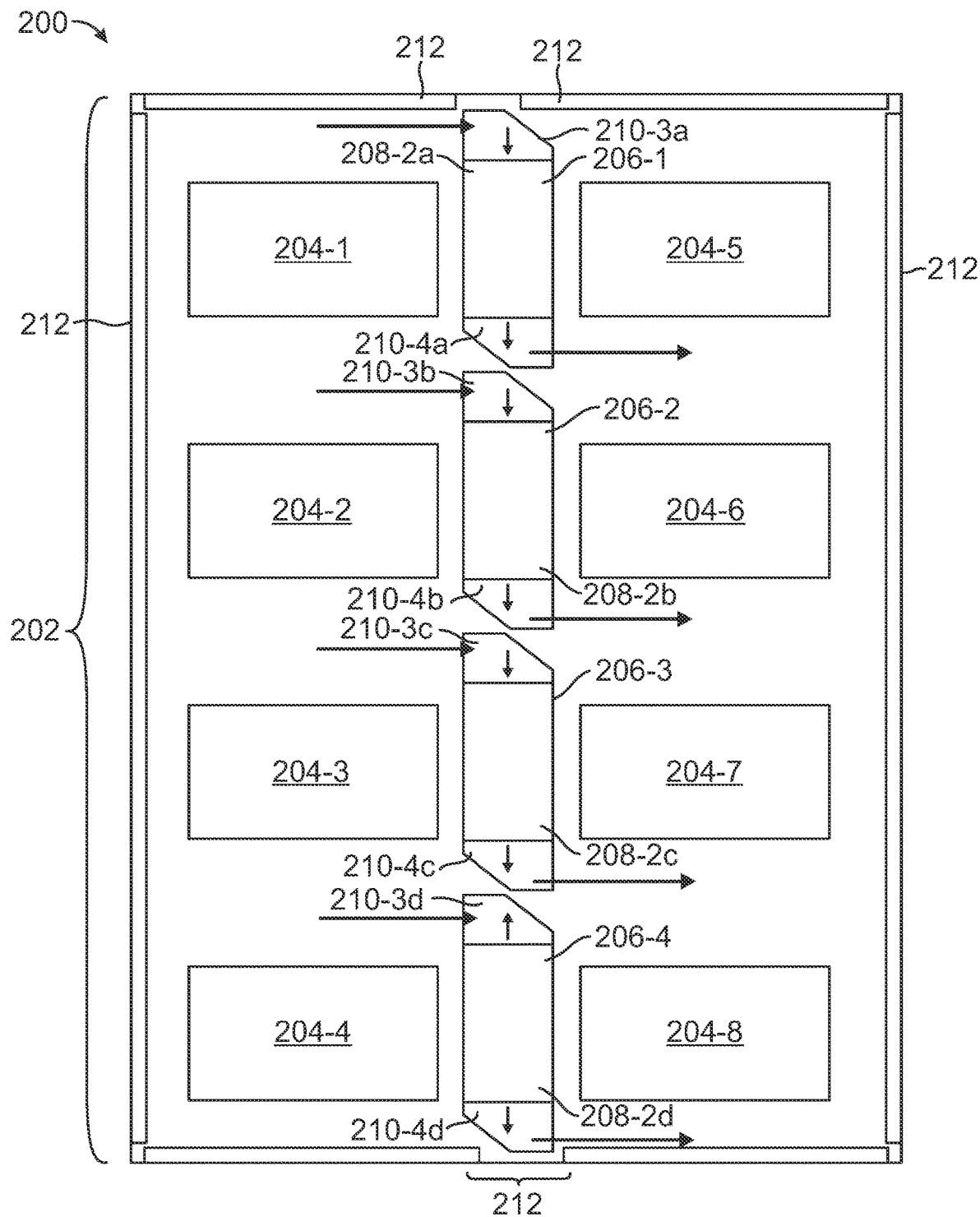
FIG. 2B depicts a right side perspective view of the system of FIG. 2A.

FIG. 2B depicts a right side perspective view of the system 200 of FIG. 2A. As shown, the system 200 includes the data storage housing 202, the plurality of hard drives 204-1, 204-2, 204-3, 204-4, 204-5, 204-6, 204-7, and 204-8, the plurality of acoustic attenuation devices 206-1, 206-2, 206-3, and 206-4, and the acoustic attenuating foam 212, each of which are implemented as previously described with reference to FIG. 2A. As shown, the acoustic attenuation devices 206-1, 206-2, 206-3, and 206-4 include second fan modules 208-2a, 208-2b, 208-2c, and 208-2d, third air deflectors 210-3a, 210-3b, 210-3c, and 210-3d, and fourth air deflectors 210-4a, 210-4b, 210-4c, and 210-4d, respectively. Although not shown, the acoustic attenuation devices 206-1, 206-2, 206-3, and 206-4 also include the first fan modules, the first air deflectors, and the second air deflectors behind the second fan modules, the third air deflectors, and the fourth air deflectors. Additionally, the acoustic attenuation devices 206-1, 206-2, 206-3, and 206-4 direct airflow in first directions (not shown) and in second directions (shown by the arrows above and below the second fan modules 208-2a, 208-2b, 208-2c, and 208-2d), where the first directions are opposite of the second directions.

Although the system 200 is shown as including four acoustic attenuation devices 206-1, 206-2, 206-3, and 206-4, the system 200 may also include less than four or more than four acoustic attenuation devices. Additionally, although the system is shown as including eight hard drives 204-1, 204-2, 204-3, 204-4, 204-5, 204-6, 204-7, and 204-8, the system 200 may also include less than eight or more than eight hard drives. The plurality of acoustic attenuation devices and the plurality of hard drives may also be arranged in configurations not shown by FIGS. 2A-2B.

In an embodiment, a system includes a data storage housing, a plurality of hard drives positioned within the data storage housing, and at least one acoustic attenuation device positioned between the plurality of hard drives within the data storage housing as previously described with reference to FIGS. 2A-2B. The at least one acoustic attenuation device includes a fan assembly that includes at least one fan module that includes a top surface and a bottom surface, and a plurality of air deflectors mounted to the top surface and the bottom surface of the at least one fan module as previously described with reference to FIGS. 1A-1D. The at least one fan module directs airflow in at least one direction and the plurality of air deflectors include a plurality of surfaces, where at least one of the plurality of surfaces is an angled surface that redirects the airflow 90-degrees. The acoustic attenuation device also includes acoustic attenuating foam, where the acoustic attenuating foam has a 2-D surface and is applied to interior surfaces of the plurality of surfaces. Additionally, the data storage housing includes a plurality of enclosing surfaces, where another acoustic attenuating foam is applied to the plurality of enclosing surfaces.

Exemplary Acoustic Attenuation Device

Figure 3A:
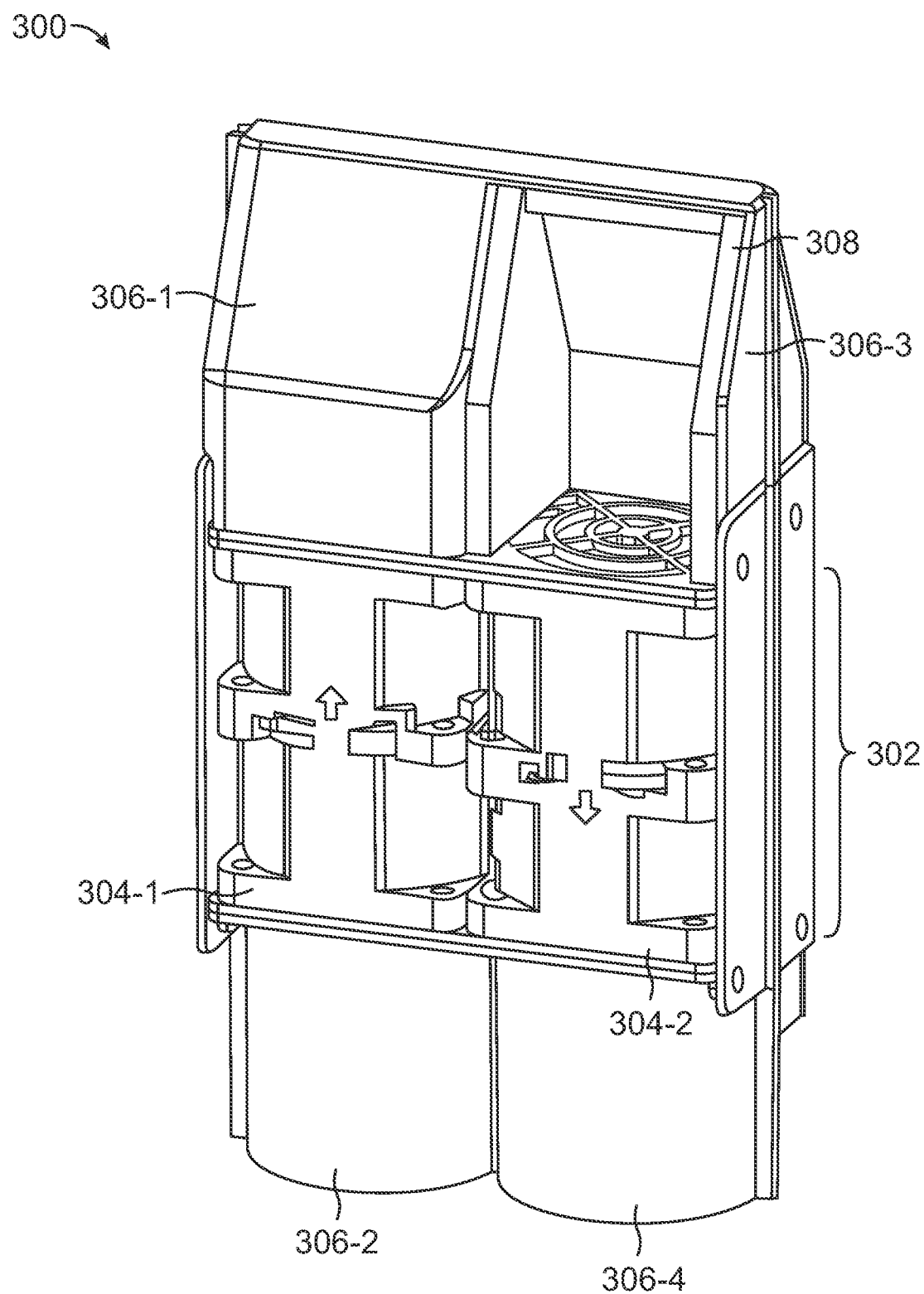
FIG. 3A depicts an isometric view of an exemplary acoustic attenuation device.

FIG. 3A depicts an isometric view of an exemplary acoustic attenuation device 300. The exemplary acoustic attenuation device 300 may have similar functionality as those shown in FIGS. 1A-1D. As shown, the exemplary acoustic attenuation device 300 includes a fan assembly 302 with a first fan module 304-1 and a second fan module 304-2, a plurality of air deflectors that includes a first air deflector 306-1, a second air deflector 306-2, a third air deflector 306-3, and a fourth air deflector 306-4, and acoustic attenuating foam 308, each of which are implemented similarly to as previously described with reference to FIGS. 1A-1D. Additionally, the first fan module 304-1 directs airflow in a first direction (shown by an arrow within the first fan module 304-1) and the second fan module 304-2 directs airflow in a second direction (shown by an arrow within the second fan module 304-2) similarly to as previously described with reference to FIGS. 1A-1D.

Figure 3C:
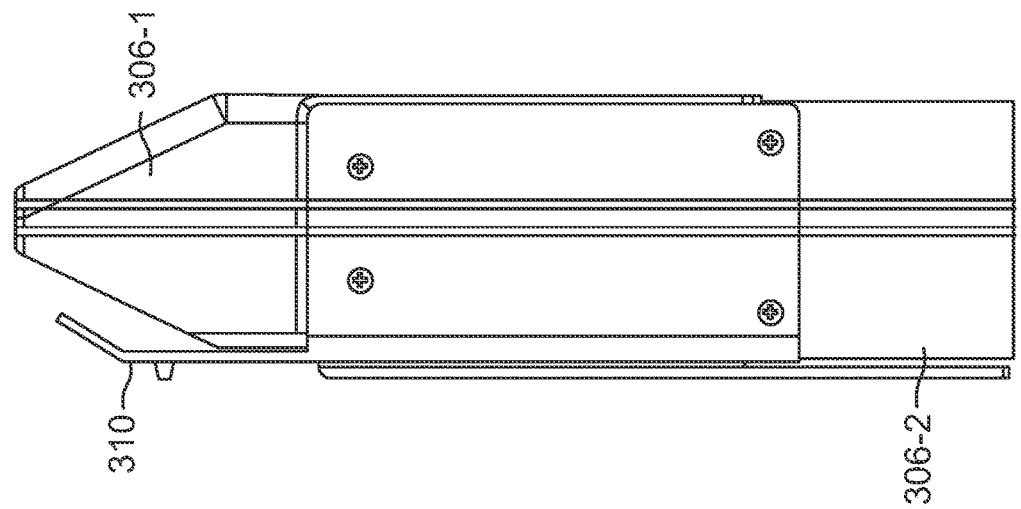
FIG. 3C depicts a left side perspective view of the exemplary acoustic attenuation device of FIG. 3A.
Figure 3B:
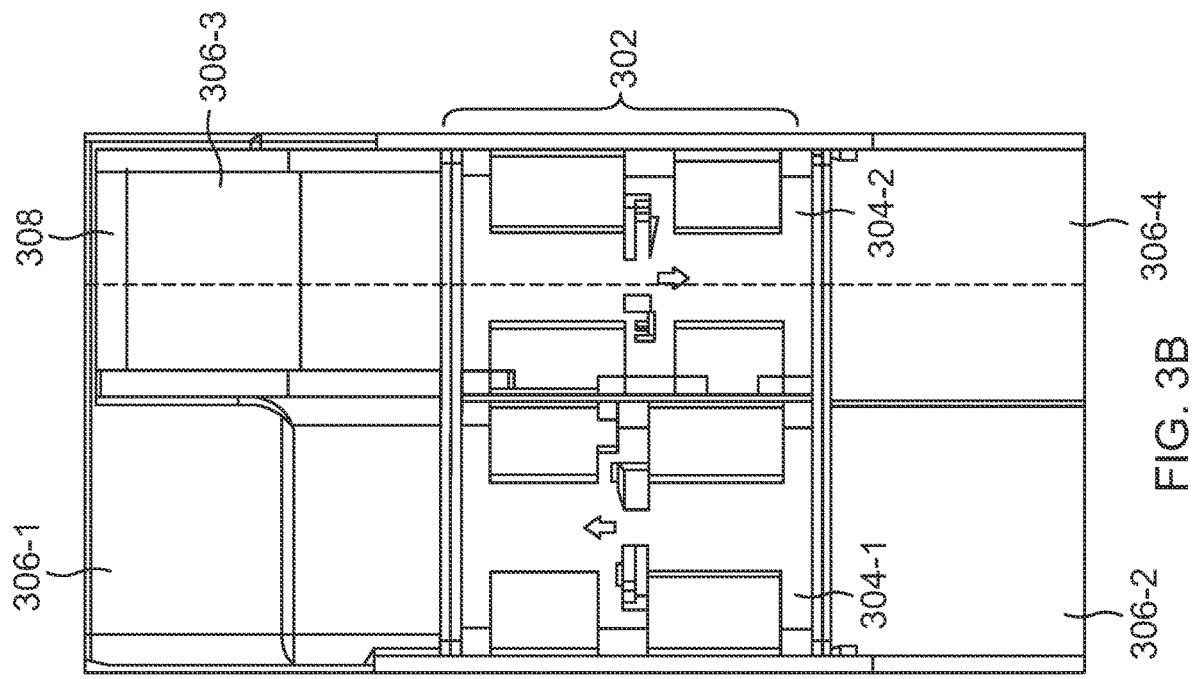
FIG. 3B depicts a front perspective view of the exemplary acoustic attenuation device of FIG. 3A.

FIG. 3B depicts a front perspective view of the exemplary acoustic attenuation device 300 of FIG. 3A. As shown, the exemplary acoustic attenuation device includes the fan assembly 302 with the first fan module 304-1 and the second fan module 304-2, the first air deflector 306-1, the second air deflector 306-2, the third air deflector 306-3, the fourth air deflector 306-4, and the acoustic attenuating foam 308, each of which are implemented as previously described with reference to FIG. 3A. Additionally, the first fan module 304-1 directs airflow in the first direction (shown by arrow within the first fan module 304-1) and the second fan module 304-2 directs airflow in the second direction (shown by an arrow within the second fan module 304-2) as previously described with reference to FIG. 3A.

FIG. 3C depicts a left side perspective view of the exemplary acoustic attenuation device 300 of FIG. 3A. As shown, the exemplary acoustic attenuation device includes the first air deflector 306-1 and the second air deflector 306-2, each of which are implemented as previously described with reference to FIG. 3A. Although not shown, the first fan module 304-1 may be between the first air deflector 306-1 and the second air deflector 306-2, and the second fan module 304-2, the third air deflector 306-3, and the fourth air deflector 306-4 are behind the first fan module 304-1, the first air deflector 306-1, and the second air deflector 306-2 from the left side perspective view of FIG. 3C.

Additionally, the exemplary acoustic attenuation device 300 includes a latch 310. In an embodiment, the latch 310 may help mount the exemplary acoustic attenuation device 300 into place within a data storage housing (e.g., data storage housing 202) by pressing against an inner edge of the data storage housing. As an example, the latch 310 may press against the inner edge of the data storage housing via a notch, a spring, or other mechanical mechanism. Additionally, the latch 310 may allow the exemplary acoustic attenuation device 300 to be dismounted from the data storage housing. For example, pressing the latch 310 in a predetermined direction may dismount the exemplary acoustic attenuation device from its position in the data storage housing, allowing the exemplary acoustic attenuation device to be removed. Although the exemplary acoustic attenuation device 300 is shown as including one latch, the exemplary acoustic attenuation device may also include more than one latch. Furthermore, although the exemplary acoustic attenuation device 300 is described as being mounted in the data storage housing via the latch 310, the exemplary acoustic attenuation device may also be mounted in the data storage housing via other mounting mechanisms.

FIG. 3D depicts a right side inner perspective view of the exemplary acoustic attenuation device 300 of FIG. 3A. As shown, the exemplary acoustic attenuation device includes the second fan module 304-2, the third air deflector 306-3, the fourth air deflector 306-4, the acoustic attenuating foam 308, and the latch 310, each of which are implemented as previously described with reference to FIG. 3A and FIG. 3C. Although not shown, the first fan module 304-1, the first air deflector 306-1, and the second air deflector 306-2 are behind the second fan module 304-2, the third air deflector 306-3, and the fourth air deflector 306-4 from the right side inner perspective view of FIG. 3D.

FIG. 3E depicts a top perspective view of the exemplary acoustic attenuation device 300 of FIG. 3A. As shown, the exemplary acoustic attenuation device includes the first fan module 304-1, the second fan module 304-2, the first air deflector 306-1, the third air deflector 306-3, the acoustic attenuating foam 308, and the latch 310, each of which are implemented as previously described with reference to FIG. 3A and FIG. 3C. Although not shown, the second air deflector 306-2 and the fourth air deflector 306-4 are below the first fan module 304-1 and the second fan module 304-2, respectively, from the top perspective view of FIG. 3E.

As may be used herein, the term "operable to" or "configurable to" indicates that an element includes one or more of components, attachments, circuits, instructions, modules, data, input(s), output(s), etc., to perform one or more of the described or necessary corresponding functions and may further include inferred coupling to one or more other items to perform the described or necessary corresponding functions. As may also be used herein, the term(s) "coupled", "coupled to", "connected to" and/or "connecting" or "interconnecting" includes direct connection or link between nodes/devices and/or indirect connection between nodes/devices via an intervening item (e.g., an item includes, but is not limited to, a component, an element, a circuit, a module, a node, device, network element, etc.). As may further be used herein, inferred connections (i.e., where one element is connected to another element by inference) includes direct and indirect connection between two items in the same manner as "connected to". As may be used herein, the terms "substantially" and "approximately" provide an industry-accepted tolerance for its corresponding term and/or relativity between items.

The various features of the disclosure described herein can be implemented in different systems and devices without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

In the foregoing specification, certain representative aspects of the invention have been described with reference to specific examples. Various modifications and changes may be made, however, without departing from the scope of the present invention as set forth in the claims. The specification and figures are illustrative, rather than restrictive, and modifications are intended to be included within the scope of the present invention. Accordingly, the scope of the invention should be determined by the claims and their legal equivalents rather than by merely the examples described. For example, the components and/or elements recited in any apparatus claims may be assembled or otherwise operationally configured in a variety of permutations and are accordingly not limited to the specific configuration recited in the claims.

Furthermore, certain benefits, other advantages and solutions to problems have been described above with regard to particular embodiments; however, any benefit, advantage, solution to a problem, or any element that may cause any particular benefit, advantage, or solution to occur or to become more pronounced are not to be construed as critical, required, or essential features or components of any or all the claims.

As used herein, the terms "comprise," "comprises," "comprising," "having," "including," "includes" or any variation thereof, are intended to reference a nonexclusive inclusion, such that a process, method, article, composition or apparatus that comprises a list of elements does not include only those elements recited, but may also include other elements not expressly listed or inherent to such process, method, article, composition, or apparatus. Other combinations and/or modifications of the above-described structures, arrangements, applications, proportions, elements, materials, or components used in the practice of the present invention, in addition to those not specifically recited, may be varied or otherwise particularly adapted to specific environments, manufacturing specifications, design parameters, or other operating requirements without departing from the general principles of the same.

Moreover, reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is intended to be construed under the provisions of 35 U.S.C. § 112(f) as a "means-plus-function" type element, unless the element is expressly recited using the phrase "means for" or, in the case of a method claim, the element is recited using the phrase "step for."

What is claimed is:

1. An acoustic attenuation device comprising:
 a fan assembly, the fan assembly including:
 a first fan module configured to direct a first airflow in a first direction; and
 a second fan module adjacent to the first fan module and configured to direct a second airflow in a second direction opposite the first direction;
 a first air deflector mounted to an outlet of the first fan module;

a second air deflector mounted to an inlet of the first fan module;

a third air deflector mounted to an inlet of the second fan module; and a fourth air deflector mounted to an outlet of the second fan module;

wherein the second and fourth air deflectors are adjacent to one another but face in opposite directions and are configured to direct air exiting the second fan module away from air entering the first fan module, and wherein the first and third air deflectors are adjacent to one another but face in opposite directions and are configured to direct air exiting the first fan module away from air entering the second fan module; and acoustic attenuating foam, wherein the acoustic attenuating foam has a two-dimensional (2-D) surface and is applied to a flat interior surface of at least one of the first, second, third and fourth air deflectors.

2. The acoustic attenuation device of claim 1, wherein the acoustic attenuating foam has a thickness between 1 millimeter (mm) and 5 mm.

3. The acoustic attenuation device of claim 1, wherein the acoustic attenuating foam is arranged to completely cover flat interior surfaces of the first, second, third and fourth air deflectors.

4. The acoustic attenuation device of claim 1, wherein the acoustic attenuating foam is selected to attenuate at least one of airflow energy and vibrational energy generated by at least one of the first fan module and the second fan module.

5. The acoustic attenuation device of claim 1, wherein flat interior surfaces of each of the air deflectors comprises an angled air deflector surface.

6. The acoustic attenuation device of claim 5, wherein the angled air deflector surfaces are angled in the range of 10-degrees to 80-degrees relative to the first and second air flow directions.

7. A system comprising:

a data storage housing;

a plurality of hard drives positioned within the data storage housing; and at least one acoustic attenuation device positioned between the plurality of hard drives within the data storage housing, and wherein the at least one acoustic attenuation device includes:

a fan assembly, the fan assembly comprising:

a first fan module configured to direct a first airflow in a first direction; and a second fan module adjacent to the first fan module and configured to direct a second airflow in a second direction opposite the first direction;

a first air deflector mounted to an outlet of the first fan module;

a second air deflector mounted to an inlet of the first fan module a third air deflector mounted to an inlet of the second fan module; and a fourth air deflector mounted to an outlet of the second fan module;

wherein the second and fourth air deflectors are adjacent to one another but face in opposite directions and are configured to direct air exiting the second fan module away from air entering the first fan module, and wherein the first and third air deflectors are adjacent to one another but face in opposite directions and are configured to direct air exiting the first fan module away from air entering the second fan module; and acoustic attenuating foam, wherein the acoustic attenuating foam has a two-dimensional (2-D) surface and is applied to a flat interior surface of at least one of the first, second, third and fourth air deflectors.

8. The system of claim 7, wherein the data storage housing includes a plurality of enclosing surfaces, and wherein another acoustic attenuating foam is applied to interior surfaces of the plurality of enclosing surfaces.

9. The system of claim 7, wherein the acoustic attenuating foam has a thickness between 1 millimeter (mm) and 5 mm.

10. The system of claim 7, wherein the acoustic attenuating foam is arranged to completely cover flat interior surfaces of the first, second, third and fourth air deflectors.

11. The acoustic attenuation device of claim 7, wherein flat interior surfaces of each of the air deflectors comprises an angled air deflector surface.

12. The acoustic attenuation device of claim 11, wherein the angled air deflector surfaces are angled in the range of 10-degrees to 80-degrees relative to the first and second air flow directions.

* * * * *